US008101237B2

(12) United States Patent
Okubo et al.

(10) Patent No.: US 8,101,237 B2
(45) Date of Patent: Jan. 24, 2012

(54) TELLURIUM PRECURSORS FOR FILM DEPOSITION

(75) Inventors: Shingo Okubo, Tsukuba (JP); Kazutaka Yanagita, Tsukuba (JP); Julien Gatineau, Ibaraki (JP)

(73) Assignee: L'Air Liquide SociétéAnonyme pour l'Etude et l'Exploitation des Procédés Georges Claude, Paris (FR)

( * ) Notice: Subject to any disclaimer, the term of this patent is extended or adjusted under 35 U.S.C. 154(b) by 281 days.

(21) Appl. No.: 12/475,204

(22) Filed: May 29, 2009

(65) Prior Publication Data

US 2009/0299084 A1 Dec. 3, 2009

Related U.S. Application Data

(60) Provisional application No. 61/057,128, filed on May 29, 2008.

(51) Int. Cl.
*C23C 16/00* (2006.01)
(52) U.S. Cl. ............ 427/255.29; 427/248.1; 427/255.31; 427/255.28
(58) Field of Classification Search ............... 427/248.1, 427/255.28, 255.31
See application file for complete search history.

(56) References Cited

U.S. PATENT DOCUMENTS

| 3,573,958 | A | 4/1971 | Small |
| 4,141,778 | A | 2/1979 | Domrachev et al. |
| 4,377,613 | A | 3/1983 | Gordon |
| 4,419,386 | A | 12/1983 | Gordon |
| 5,656,338 | A | 8/1997 | Gordon |
| 6,984,591 | B1 | 1/2006 | Buchanan et al. |
| 7,413,776 | B2 | 8/2008 | Shenai-Khatkhate et al. |
| 2006/0063394 | A1 | 3/2006 | McSwiney et al. |
| 2006/0138393 | A1 | 6/2006 | Seo et al. |
| 2006/0172067 | A1 | 8/2006 | Ovshinsky et al. |
| 2006/0172068 | A1 | 8/2006 | Ovshinsky |
| 2006/0180811 | A1 | 8/2006 | Lee et al. |
| 2006/0292301 | A1 | 12/2006 | Herner |
| 2007/0054475 | A1 | 3/2007 | Lee et al. |
| 2008/0003359 | A1 | 1/2008 | Gordon et al. |
| 2008/0026577 | A1 | 1/2008 | Shenai-Khatkhate et al. |
| 2008/0035906 | A1 | 2/2008 | Park et al. |
| 2008/0096386 | A1 | 4/2008 | Park et al. |
| 2008/0108174 | A1 | 5/2008 | Park et al. |
| 2008/0118636 | A1 | 5/2008 | Shin et al. |
| 2009/0137100 | A1* | 5/2009 | Xiao et al. ............... 438/478 |
| 2009/0142881 | A1 | 6/2009 | Xiao et al. |
| 2009/0280052 | A1 | 11/2009 | Xiao et al. |
| 2009/0299084 | A1 | 12/2009 | Okubo et al. |

FOREIGN PATENT DOCUMENTS

| DE | 42 34 998 | 4/1994 |
| EP | 0 568 074 | 11/1993 |
| EP | 1 180 553 | 2/2002 |
| EP | 1 464 724 | 10/2004 |
| EP | 1 464 725 | 10/2004 |
| EP | 1 806 427 | 7/2007 |
| EP | 1 995 236 | 11/2008 |
| EP | 1995236 A1 * | 11/2008 |
| WO | WO 83 01018 | 3/1983 |
| WO | WO 96 40448 | 12/1996 |
| WO | WO 98 16667 | 4/1998 |
| WO | WO 00 23635 | 4/2000 |
| WO | WO 00 29637 | 5/2000 |
| WO | WO 01 66816 | 9/2001 |
| WO | WO 02 27063 | 4/2002 |
| WO | WO 03 083167 | 10/2003 |
| WO | WO 2007 062096 | 5/2007 |
| WO | WO 2007 067604 | 6/2007 |
| WO | WO 2007 133837 | 11/2007 |
| WO | WO 2008 002546 | 1/2008 |
| WO | WO 2008 008319 | 1/2008 |
| WO | WO 2008 057616 | 5/2008 |
| WO | WO 2009 039187 | 3/2009 |
| WO | WO 2009 081383 | 7/2009 |
| WO | WO 2009 132207 | 10/2009 |

OTHER PUBLICATIONS

Bonasia, P.J. et al. "New reagents for the synthesis of compounds containing metal-tellurium bonds: sterically hindered silyltellurolate derivatives and the x-ray crystal structures of [(THF)2LiTeSi(SiMe3)3]2 and [(12-crown-4)2Li][TeSi(SiMe3)3]", J. Am. Chem. Soc., 1992, 114 (13), pp. 5209-5214.

Breunig, H.J. "Thermochromic molecules with bonds of Se or Te and Sb or Bi", Phosphorus and Sulfur, 1988, vol. 38, pp. 97-102.

Choi, et al. "Plasma-enhanced atomic layer deposition of $Ge_2Sb_2Te_5$ films using metal-organic sources for Phase change RAM." ALD 2006 proceedings, p. 62, 2006.

Drake, J.E. et al. "Studies of silyl and germyl group 6 species. 5. Silyl and germyl derivatives of methane- and benzenetellurols," Inorg. Chem. 1980, 19, pp. 1879-1883.

Gonzalez-Hernandez, et al. "Structure of oxygen-doped Ge:Sb:Te films." Thin Solid Films (2006), 503(1-2), 13-17.

Gu et al. "Optical and structural properties of oxygen-doped and annealed Ge-Sb-Te-thin films." Chinese Journal of Lasers (2003), 30(12), 1110-1115.

Kim, et al. "Phase separation of a $Ge_2Sb_2Te_5$ alloy in the transition from an amorphous structure to crystalline structures." J. Vac. Sci. Technol. 929, 24(4), 2006.

King, R.B. "Secondary and tertiary phosphine adducts of germanium(II) iodide", Inorganic Chemistry, vol. 2, No. 1, Feb. 1963.

Lee, J. et al. "GeSbTe deposition for the PRAM application". Appl. Surf. Sci., 253, pp. 3969-3976, 2007.

(Continued)

*Primary Examiner* — David Turocy
(74) *Attorney, Agent, or Firm* — Patricia E. McQueeney

(57) ABSTRACT

Methods and compositions for depositing a tellurium containing film on a substrate are disclosed. A reactor and at least one substrate disposed in the reactor are provided. A tellurium containing precursor is provided and introduced into the reactor, which is maintained at a temperature of at least 100° C. Tellurium is deposited on to the substrate through a deposition process to form a thin film on the substrate.

10 Claims, 1 Drawing Sheet

OTHER PUBLICATIONS

Nefedov O.M. et al., "Molecular complexes of germylene with n-donor ligands", Proceedings of the Academy of Sciences of the USSR Series Chemical, 1980, pp. 170-173, 1980.

Nefedov O.M. et al., "New adducted complexes of dichlorogermanium", Proceedings of the Academy of Sciences of the USSR Series Chemical, 1973, No. 12, pp. 2824-2825.

Pore, V. et al. "Atomic layer deposition of metal tellurides and selenides using alkylsilyl compounds of tellurium and selenium," J. Am. Chem. Soc., DOI 10.1021/ja8090388.

Razuvaev, G.A. et al. "Organosilicon and organogermanium derivatives with silicon-metal and germanium-metal bonds," http://media.iupac.org/publications/pac/1969/pdf/1903x0353.pdf.

Shcherbinin, V.V. et al. "Methods for preparing germanium dihalides," Russian J. of General Chem., vol. 68, No. 7, 1998, pp. 1013-1016.

Wang, et al. "Influence of Sn doping upon the phase change characteristics of $Ge_2Sb_2Te_5$." Phys. Stat. Sol. (A) 3087-3095, 201(14), 2004.

International Search Report and Written Opinion for PCT/US2008/076698 / U.S. Appl. No. 12/212,350.

International Search Report and Written Opinion for PCT/IB2008/055499 / U.S. Appl. No. 12/341,685.

Kim, R-Y et al. "Structural properties of $Ge_2Sb_2Te_5$ thin films by metal organic chemical vapor deposition for phase change memory applications." Applied Physics Letters 89, 102107 (2006).

Lee, J. et al. "GeSbTe deposition for the PRAM application." Applied Surface Science 253 (2007) 3969-3976.

Choi B. J. et al. "Cyclic PECVD of $Ge_2Sb_2Te_5$ films using metal-lorganic sources." J. Electrochem. Soc., 154 (4) H318-H324 (2007).

Glatz, F. et al. "Thermal CVD of amorphous germanium films from 2,5-bis(tert.-butyl)-2,5-diaza-1-germa-cyclopentane organometallic precursor." Mat. Res. Soc. Symp. Proc., 1994, vol. 336, pp. 541-545.

Herrmann, W.A. et al. "Stable cyclic germanediyls ("cyclogermylenes"); Synthesis, structure, metal complexes, and thermolyses." Angew. Chem. Int. Ed. Engl., (1992) 31, No. 11, pp. 1485-1488.

Lappert, M.F. et al. "Monomeric, coloured germanium(II) and tin(II) di-t-butylamides, and the crystal and molecular structure of $Ge(NCMe_2[CH_2]_3CMe_2)_2$". J. Chemical Soc. Chem. Comm. 1980, pp. 621-622.

Prokop, J. et al. "Selective deposition of amorphous germanium on Si with respect to $SiO_2$ by organometallic CVD." J. NonCryst. Solids, 198-200 (1996) pp. 1026-1028.

International Search Report and Written Opinion for co-pending PCT/IB2009/008067.

Groshens, T.J. et al., "Low temperature MOCVD growth of V/VI materials via a $Me_3SiNMe_2$ elimination reaction." Thermoelectrics, 1996. Fifteen International Conference on Pasadena, CA, USA Mar. 26-29, 1996, New York, Mar. 26, 1996, 430-434.

Akkari, A. et al., "Three coordinate divalent Group 14 element compounds with a β-diketiminate as supporting ligand $L^2MX$ $[L^2=PhNC(Me)CHC(Me)NPh, X=CI, I; M=Ge, Sn]$", Journal of Organometallic Chemistry 622 (2001) pp. 190-198.

Ayers, A.E. et al., "Azido derivatives of Germanium(II) and Tin(II): Syntheses and characterization of $[(Mes)^2DAP]GeN^3$, $[(Mes)_2DAP]SnN_3$, and the corresponding chloro analogues featuring heterocyclic six-π-electron ring systems (where $[(Mes)_2DAP]=N(Mes)C(Me)\}_2CH)$," Inorg. Chem. 2001, 40, pp. 1000-1005.

Chizmeshya, A.V.G. et al., "Synthesis of butane-like SiGe hydrides: Enabling precursors for CVD of Ge-rich semiconductors," J. Am. Chem. Soc. 2006, 128, pp. 6919-6930.

Dabbousi, B.O. et al., "$(Me_3Si)_3SiTeH$: preparation, characterization, and synthetic utility of a remarkably stable tellurol," J. Am. Chem. Soc., 1991, 113, pp. 3186-3188.

Detty, M.R. et al., "Bis(trialkylsilyl) chalcogenides. 1. Preparation and reduction of group 6A oxides," J. Org. Chem., 1982, 47, pp. 1354-1356.

Ding, Y. et al., "Synthesis and structures of monomeric divalent germanium and tin compounds containing a bulky diketiminato ligand," Organometallics 2001, 20, pp. 1190-1194.

Du Mont, W.W. et al., "Triorganophosphan-dichlor- und -dibroringermandiyl und -stannandiyl: Phosphan-stabilisierte $Ge^{II}$- und $Sn^{II}$-Halogenide," Angew. Chem. 88 Jahr. 1976, Nr. 9, p. 303.

Eom, T. et al., "Atomic Layer Deposition of $(GeTe2)x(Sb2Te3)y$ films for phase change memories," Proceedings of Seoul National University Conference, Feb. 16-18, 2011.

Jutzi, P. et al., "Stabilization of Monomeric Dichlorogermylene," Angew. Chem. Internat. Edit. vol. 12 (1973), No. 12, pp. 1002-1003.

Kouvetakis, J. et al., "Synthesis and atomic and electronic structure of new Si-Ge-C alloys and compounds," Chem. Matter. 1998, 10, pp. 2935-2949.

Lee, V.Y. et al., "Redox properties of dihalogermylenes, dihalostannylenes and their complexes with Lewis bases," Journal of Organometallic Chemistry, 499 (1995) pp. 27-34.

Mironov, V.B. et al., "New method for preparing germanium dichloride and its use in syntheses of organogermanium compounds," Russian Journal of General Chemistry, vol. 64, No. 8, Part 1, 1994, p. 1180.

Mironov, V.B. et al., "New routes to germanium dihalide dioxanates," Russian Journal of General Chemistry, vol. 64, No. 4, Part 2, 1994, p. 633.

Nagendra, S. et al., "RGe(I)Ge(I)R compound (R=PhC(NtBu))_2 with a Ge-Ge single bond and a comparison with the gauche conformation of hydrazine," Organometallics 2008, 27, p. 5459-5463.

Naghavi, N. et al., "Growth studies and characterisation of In2S3 thin films deposited by atomic layer deposition (ALD)," Applied Surface Science 222 (2004) pp. 65-73.

Nefedov, O.M. et al., "Inorganic, organometallic, and organic analogues of carbenes," Angew. Chem. Internat. Edit., vol. 5 (1966), No. 12, pp. 1021-1038.

N-Methyl Morpholine product specification, downloaded from http://chemicalland21.com/industrialchem/functional%20Monomer/N-METHYL%20MORPHOLINE.htm Sep. 1, 2010.

Pacl, Z. et al., "Organogermainum compounds. X. The effect of structure on the basicity of ethyl(dimethylamino)germanes," Collection Czechoslov, Chem. Commun. vol. 36, 1971, pp. 2181-2188.

Ritala, M. et al., "Atomic layer deposition of $Ge2Sb2Te_5$ thin films," Microelectronic Engineering, Oct. 2009, vol. 86, No. 7-9, pp. 1946-1949.

Riviere, P. et al., "Germanium(II) and germanium(IV) compounds form elemental germanium," Organometallics 1991, 10, pp. 1227-1228.

Woelk, E. et al., "Designing novel organogermanium OMVPE precursors for high[purity germanium films," Journal of Crystal Growth 287 (2006), pp. 684-687.

International Search Report and Written Opinion for PCT/IB2010/053961, Nov. 9, 2010.

* cited by examiner

TELLURIUM PRECURSORS FOR FILM DEPOSITION

CROSS REFERENCE TO RELATED APPLICATIONS

The present application claims the benefit of U.S. Provisional Application Ser. No. 61/057,128 filed May 29, 2008, the entire contents of which are incorporated herein by reference.

BACKGROUND

1. Field of the Invention

This invention relates generally to the field of semiconductor, photovoltaic, flat panel or LCD-TFT device fabrication.

2. Background of the Invention

Phase change materials are used in standard bulk silicon technologies to form the memory elements of nonvolatile memory devices. Phase change materials exhibit at least two different states, one being amorphous and the other(s) crystalline. The amorphous state is characterized by the absence of crystallinity or the lack of long range order, as opposed to crystallized states, which are characterized by a long range order. Accordingly, the order in a unit cell, which is repeated a large number of times, is representative of the whole material.

Each memory cell in a nonvolatile memory device may be considered as a variable resistor that reversibly changes between higher and lower resistivity states corresponding to the amorphous state and the crystalline state of the phase change material. The states can be identified because each state can be characterized by a conductivity difference of several orders of magnitude. In these devices, the phase changes of the memory element are performed by direct heating of the phase change material with high programming currents. Conventionally, bipolar transistors are used to deliver high programming currents by directly heating the phase change material. The high current produces direct heating of the phase change material, which can cause the phase change material to degrade over repeated programming operations, thereby reducing memory device performance.

Among the materials of practical use today, most contain germanium. Of those materials, the most extensively studied material is $Ge_2Sb_2Te_5$. While the deposition can be conventionally performed by plasma vapor deposition (PVD) techniques such as sputtering, chemical vapor deposition (CVD) and atomic layer deposition (ALD) and related techniques including pulse-CVD, remote plasma CVD, plasma assisted CVD, plasma enhanced ALD, a variety of materials are now being studied in order to overcome the challenges of deposition in complex structures, including those consisting of trenches. The use of $Ge(tBu)_4$, $Sb(iPr)_3$ and $Te(iPr)_2$ has been reported, for instance. The use of such molecules for the deposition of germanium-antimony-tellurium (GST) material raises some difficulties, however. For example, many germanium containing precursors are insufficiently thermally stable for a reproducible process. Although there have been significant advancements in the art, there is continuing interest in the design and use of precursor compounds with improved stability.

Consequently, there exists a need for tellurium containing precursors which are stable enough to allow deposition at low temperatures.

BRIEF SUMMARY

The invention provides novel methods and compositions for the deposition of tellurium containing films, or germanium antimony telluride ("GST") films on a substrate. In an embodiment, a method for depositing a tellurium or GST type film on a substrate comprises providing a reactor, and at least one substrate disposed in the reactor. A tellurium containing precursor is provided, where the precursor has one of the following general formulas:

  (I)

  (IIa)

  (IIb)

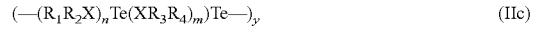  (IIc)

  (III)

  (IV)

wherein each of $R_{1-6}$ is independently selected from among: H, a C1-C6 alkyl, a C1-C6 alkoxy, a C1-C6 alkylsilyl, a C1-C6 perfluorocarbon, a C1-C6 alkylsiloxy, a C1-C6 alkylamino, an alkylsilylamino, and an aminoamido; X is carbon, silicon or germanium; n and m are integers selected from 0, 1, and 2; in formulas (IIa) and (IIb), y is an integer selected from 2, 3 and 4; in formula (IIc), y is an integer selected from 1, 2 and 3. The tellurium containing precursor is introduced into the reactor. The reactor is maintained at a temperature of at least 100° C., and at least part of the precursor is deposited onto the substrate to form a tellurium containing film.

In an embodiment, a tellurium precursor comprises a precursor with one of the following general formulas:

  (I)

  (IIa)

  (IIb)

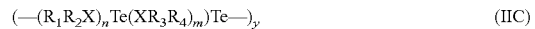  (IIC)

  (III)

  (IV)

wherein each of $R_{1-6}$ is independently selected from among: H, a C1-C6 alkyl, a C1-C6 alkoxy, a C1-C6 alkylsilyl, a C1-C6 perfluorocarbon, a C1-C6 alkylsiloxy, a C1-C6 alkylamino, an alkylsilylamino, and an aminoamido; X is carbon, silicon or germanium; n and m are integers selected from 0, 1, and 2; in formulas (IIa) and (IIb), y is an integer selected from 2, 3 and 4; in formula (IIc), y is an integer selected from 1, 2 and 3.

Other embodiments of the current invention may include, without limitation, one or more of the following features:
- maintaining the reactor at a temperature between about 100° C. and about 500° C., and preferably between about 150° C. and about 350° C.;
- maintaining the reactor at a pressure between about 1 Pa and about $10^5$ Pa, and preferably between about 25 Pa and about $10^3$ Pa;
- introducing at least one reducing gas into the reactor, wherein the reducing gas is at least one of: hydrogen; ammonia; silane; disilane; trisilane; hydrogen radicals; and mixtures thereof:
- the tellurium precursor and the reducing gas are introduced into the chamber either substantially simultaneously or sequentially;
- the tellurium precursor and the reducing gas are introduced into the chamber substantially simultaneously and the chamber is configured for chemical vapor deposition;

the tellurium precursor and the reducing gas are introduced into the chamber sequentially and the chamber is configured for atomic layer deposition;
a tellurium containing thin film coated substrate;
introducing at least one germanium containing precursor and at least one antimony containing precursor; and
depositing at least part of the germanium and antimony containing precursors onto the substrate to form a germanium, tellurium and antimony (GST) containing film; and
the telluium precursor is at least one of: Te(GeMe$_3$)$_2$; Te(GeEt$_3$)$_2$; Te(GeiPr$_3$)$_2$; Te(GetBu$_3$)$_2$; Te(GetBuMe$_2$)$_2$; Te(SiMe$_3$)$_2$; Te(SiEt$_3$)$_2$; Te(SiiPr$_3$)$_2$; Te(SitBu$_3$)$_2$; Te(SitBuMe$_2$)$_2$; Te(Ge(SiMe$_3$)$_3$)$_2$; Te(Si(SiMe$_3$)$_3$)$_2$; Te(GeMe$_3$)(Si(SiMe$_3$)$_3$), Te(Ge(SiMe$_3$)$_3$)$_2$; ((GeMe$_2$)Te—)$_3$; ((GeEt$_2$)Te—)$_3$; ((GeMeEt)Te—)$_3$; ((GeiPr$_2$)Te—)$_4$; ((SiMe$_2$)Te—)$_3$; ((SiEt$_2$)Te—)$_3$; ((SiMeEt)Te—)$_3$; ((SiiPr$_2$)Te—)$_4$ ;((GeMe$_2$)$_2$Te(GeMe$_2$)$_2$Te—); ((GeMe$_2$)$_3$Te—)$_2$; ((SiMe$_2$)$_3$Te—)$_2$; CH$_2$CH$_2$GeMe$_2$TeGeMe$_2$—; SiMe$_2$SiMe$_2$GeMe$_2$TeGeMe$_2$—; Te(GeNtBuCH$_2$CH$_2$NtBu); Te(GeNtBuCH=CHNtBu); Te((GeNtBuCH(CH$_3$)CH(CH$_3$)NtBu); Te(SiNtBuCH$_2$CH$_2$NtBu); Te(SiNtBuCH=CHNtBu); and Te((SiNtBuCH(CH$_3$)CH(CH$_3$)NtBu).

The foregoing has outlined rather broadly the features and technical advantages of the present invention in order that the detailed description of the invention that follows may be better understood. Additional features and advantages of the invention will be described hereinafter that form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

Notation and Nomenclature

Certain terms are used throughout the following description and claims to refer to various components and constituents. This document does not intend to distinguish between components that differ in name but not function.

As used herein, the term "alkyl group" refers to saturated functional groups containing exclusively carbon and hydrogen atoms. Further, the term "alkyl group" may refer to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation, "Me," refers to a methyl group; the abbreviation, "Et," refers to an ethyl group; the abbreviation, "tBu," refers to a tertiary butyl group; the abbreviation "iPr" refers to an isopropyl group.

As used herein, the term "independently" when used in the context of describing R groups should be understood to denote that the subject R group is not only independently selected relative to other R groups bearing different subscripts or superscripts, but is also independently selected relative to any additional species of that same R group. For example in the formula MR$^1_x$(NR$^2$R$^3$)$_{(4-x)}$, where x is 2 or 3, the two or three R$^1$ groups may, but need not be identical to each other or to R$^2$ or to R$^3$, Further, it should be understood that unless specifically stated otherwise, values of R groups are independent of each other when used in different formulas.

BRIEF DESCRIPTION OF THE DRAWINGS

For a further understanding of the nature and objects for the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1:
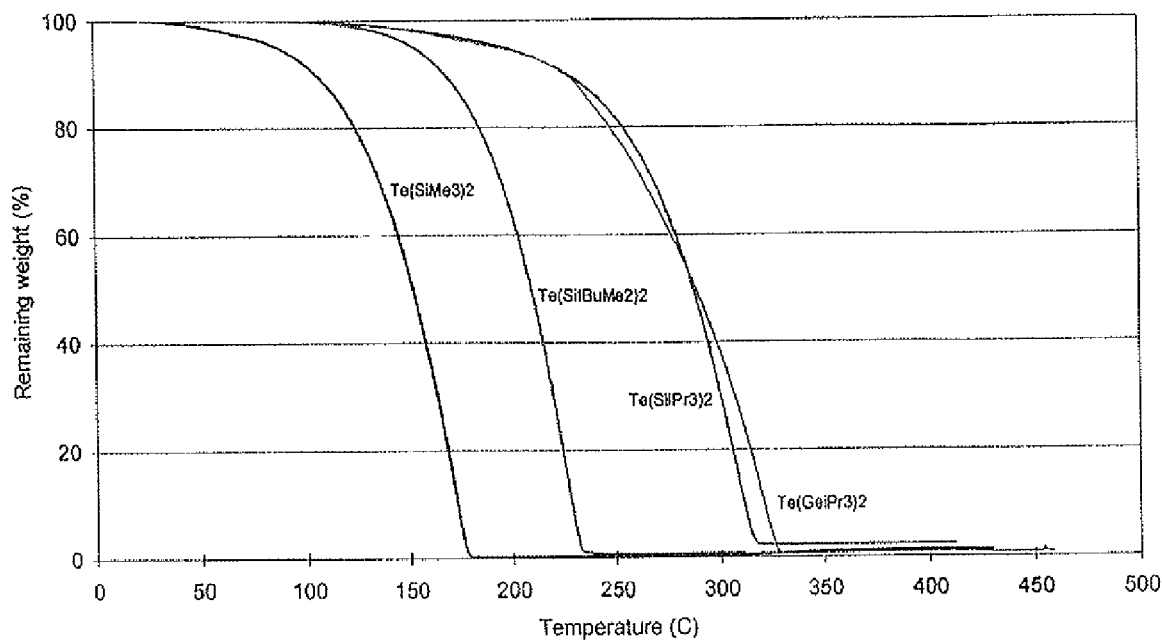
FIG. 1 illustrates a thermo-gravimetric analysis of several tellurium precursors, according to embodiments of the current invention.

Generally, embodiments of the current invention relate to methods and compositions for the deposition of tellurium and GST type films on a substrate. In an embodiment, the tellurium precursor comprises a precursor with one of the following general formulas:

$$(XR_1R_2R_3)Te(XR_4R_5R_6) \tag{I}$$

$$(—(R_1R_2X)_nTe—)_y \tag{IIa}$$

$$(—(R_1R_2X)_nTe(XR_3R_4)_m—)_y \tag{IIb}$$

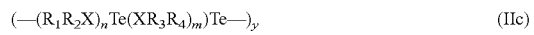

$$(—(R_1R_2X)_nTe(XR_3R_4)_m Te—)_y \tag{IIc}$$

$$Te(XNR_1CR_2R_3CR_4R_5NR_6) \tag{III}$$

$$Te(XNR_1CR_2=CR_3NR_4) \tag{IV}$$

wherein each of R$_{1-6}$ is independently selected from among: H, a C1-C6 alkyl, a C1-C6 alkoxy, a C1-C6 alkylsilyl, a C1-C6 perfluorocarbon, a C1-C6 alkylsiloxy, a C1-C6 alkylamino, an alkylsilylamino, and an aminoamido; X is carbon, silicon or germanium; n and m are integers selected from 0, 1, and 2; in formulas (IIa) and (IIb), y is an integer selected from 2, 3 and 4; in formula (IIc), y is an integer selected from 1, 2 and 3.

In embodiments where tellurium precursor has the general formula (I), the precursors are linear and can be shown schematically as:

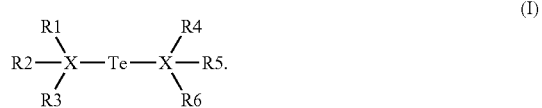

Examples of precursors covered by formula (I) include, but are not limited to: Te(GeMe$_3$)$_2$; Te(GeEt$_3$)$_2$; Te(GeiPr$_3$)$_2$; Te(GetBu$_3$)$_2$; Te(GetBuMe$_2$)$_2$; Te(SiMe$_3$)$_2$; Te(SiEt$_3$)$_2$; Te(SiiPr$_3$)$_2$; Te(SitBu$_3$)$_2$; Te(SitBuMe$_2$)$_2$; Te(Ge(SiMe$_3$)$_3$)$_2$; Te(Si(SiMe$_3$)$_3$)$_2$; Te(GeMe$_3$)(Si(SiMe$_3$)$_3$); and Te(Ge(SiMe$_3$)$_3$)$_2$.

In embodiments where the tellurium precursor has the general formula (IIa), the precursors are cyclic and the case where y=3 and n=1 can be shown schematically as:

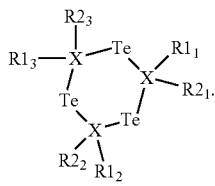
(IIa)

In embodiments where the tellurium precursor has the general formula (IIb), the precursors are cyclic and the case where y=2, n=1, and m=2 can be shown schematically as:

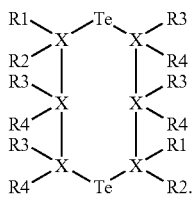
(IIb)

In embodiments where the tellurium precursor has the general formula (IIc), the precursors are cyclic and the case where y=1, n=2, and m=1 can be shown schematically as:

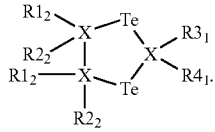
(IIc)

Examples of precursors covered by general formulas (IIa), (IIb) and (IIc) include, but are not limited to: ((GeMe$_2$)Te—)$_3$; ((GeEt$_2$)Te—)$_3$; ((GeMeEt)Te—)$_3$; ((GeiPr$_2$)Te—)$_4$; ((SiMe$_2$)Te—)$_3$; ((SiEt$_2$)Te—)$_3$; ((SiMeEt)Te—)$_3$; ((SiiPr$_2$)Te—)$_4$; ((GeMe$_2$)$_2$Te(GeMe$_2$)$_2$Te—); ((GeMe$_2$)$_3$Te—)$_2$; ((SiMe$_2$)$_3$Te—)$_2$; CH$_2$CH$_2$GeMe$_2$TeGeMe$_2$—; and SiMe$_2$SiMe$_2$GeMe$_2$TeGeMe$_2$—.

In embodiments where the tellurium precursor has the general formula (III), the precursors can be shown schematically as:

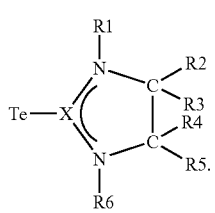
(III)

In embodiments where the tellurium precursor has the general formula (IV), the precursors can be shown schematically as:

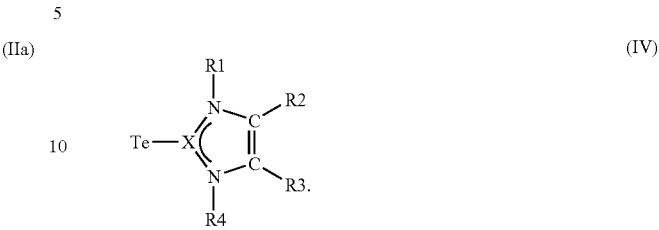
(IV)

Examples of precursors covered by general formulas (III) and (IV) include, but are not limited to: Te(GeNtBuCH$_2$CH$_2$NtBu); Te(GeNtBuCH=CHNtBu); Te((GeNtBuCH(CH$_3$)CH(CH$_3$)NtBu); Te(SiNtBuCH$_2$CH$_2$NtBu): Te(SiNtBuCH=CHNtBu); and Te((SiNtBuCH(CH$_3$)CH(CH$_3$)NtBu).

Embodiments of the tellurium precursor, as according to the instant invention, may be synthesized in various ways. Examples of synthesis of the tellurium precursor include, but are not limited to synthesis schemes 1-5 as shown below:

Scheme 1

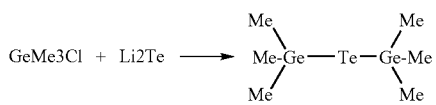

Scheme 2

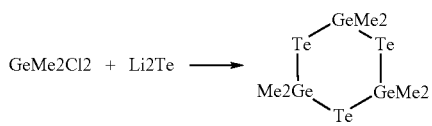

Scheme 3

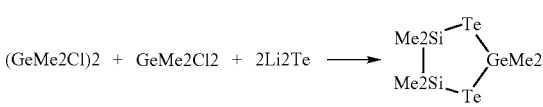

Scheme 4

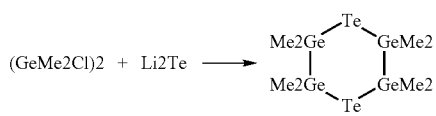

Scheme 5

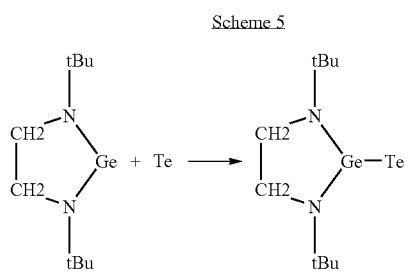

The disclosed precursors may be deposited to form a thin film using any deposition methods known to those of skill in the art. Examples of suitable deposition methods include without limitation, conventional CVD, atomic layer deposition (ALD), and pulsed chemical vapor deposition (P-CVD). In some embodiments, a thermal CVD deposition is preferred.

In an embodiment, a precursor in vapor form is introduced into a reactor. The precursor in vapor form may be produced by vaporizing a liquid precursor solution, through a conventional vaporization step such as direct vaporization, distillation, or by bubbling an inert gas (e.g. $N_2$, He, Ar, etc.) into the precursor solution and providing the inert gas plus precursor mixture as a precursor vapor solution to the reactor. Bubbling with an inert gas may also remove any dissolved oxygen present in the precursor solution.

Generally, the reactor contains one or more substrates on to which the thin films will be deposited. The one or more substrates may be any suitable substrate used in semiconductor, photovoltaic, flat panel, or LCD-TFT device manufacturing. Examples of suitable substrates include without limitation, silicon substrates, silica substrates, silicon nitride substrates, silicon oxy nitride substrates, tungsten substrates, or combinations thereof. Additionally, substrates comprising tungsten or noble metals (e.g. platinum, palladium, rhodium, or gold) may be used. Substrates may contain one or more additional layers of materials, which may be present from a previous manufacturing step. Dielectric and conductive layers are examples of these.

The reactor or deposition chamber may be a heated vessel which has at least one or more substrates disposed within. The reactor has an outlet, which may be connected to a vacuum pump to allow by products to be removed from the chamber, or to allow the pressure within the reactor to be modified or regulated. The temperature in the chamber is normally maintained at a suitable temperature for the type of deposition process which is to be performed. In some cases, the chamber may be maintained at a lower temperature, for instance when the substrates themselves are heated directly, or where another energy source (e.g. plasma or radio frequency source) is provided to aid in the deposition. Examples of reactors include, without limitation, a cold-wall type reactor, a hot-wall type reactor, a single-wafer reactor, a multi-wafer reactor, or other types of deposition systems under conditions suitable to cause the precursors to react and form the layers.

Depending on the particular process parameters, deposition may take place for a varying length of time. Generally, deposition may be allowed to continue as long as desired to produce a film with the necessary properties. Typical film thicknesses may vary from several hundred angstroms to several hundreds of microns, depending on the specific deposition process.

In some embodiments, the deposition chamber is maintained at a temperature greater than about 100° C. In some embodiments, the temperature is maintained between about 100° C. and about 500° C., preferably, between about 150° C. Likewise, the pressure in the deposition chamber is maintained at a pressure between about 1 Pa and about $10^5$ Pa, and preferably between about 25 Pa, and about $10^3$ Pa.

In some embodiments, a reducing gas is also introduced into the reaction chamber. The reducing gas may be one of hydrogen; ammonia; silane; disilane; trisilane; hydrogen radicals; and mixtures thereof. When the mode of deposition is chemical vapor deposition, the germanium precursor and the reducing gas may be introduced to the reaction chamber substantially simultaneously. When the mode of deposition is atomic layer deposition, the germanium precursor and the reducing gas may be introduced sequentially, and in some cases, there may be an inert gas purge introduced between the precursor and reducing gas.

In some embodiments, further precursors containing germanium and antimony may also be provided and deposited on the substrate. By providing germanium, tellurium, and antimony containing precursors, a chalcogenide glass type film may be formed on the substrate, for instance, GeTe—$Sb_2Te_3$ or $Ge_2Sb_2Te_5$.

The precursor and any optional reactants or precursors may be introduced sequentially (as in ALD) or simultaneously (as in CVD) into the reaction chamber. In some embodiments, the reaction chamber is purged with an inert gas between the introduction of the precursor and the introduction of the reactant. In one embodiment, the reactant and the precursor may be mixed together to form a reactant/precursor mixture, and then introduced to the reactor in mixture form.

In some embodiments, the precursor vapor solution and the reaction gas may be pulsed sequentially or simultaneously (e.g. pulsed CVD) into the reactor. Each pulse of precursor may last for a time period ranging from about 0.01 seconds to about 10 seconds, alternatively from about 0.3 seconds to about 3 seconds, alternatively from about 0.5 seconds to about 2 seconds. In another embodiment, the reaction gas may also be pulsed into the reactor. In such embodiments, the pulse of each gas may last for a time period ranging from about 0.01 seconds to about 10 seconds, alternatively from about 0.3 seconds to about 3 seconds, alternatively from about 0.5 seconds to about 2 seconds.

EXAMPLES

The following non-limiting examples are provided to further illustrate embodiments of the invention. However, the examples are not intended to be all inclusive and are not intended to limit the scope of the inventions described herein.

Example 1

Thermal characterization of tellurium precursors, according to some embodiments of the current invention, were performed.

All the thermo-gravimetric analyses (TGA) were performed in an inert atmosphere in order to avoid reaction of the molecules with air and moisture (same atmosphere encountered in the deposition process). The experiments were performed at atmospheric pressure.

The results of the thermo-gravimetric analyses of Te(SiMe$_3$)$_2$, Te(SiiPr$_3$)$_2$, Te(SitBuMe$_2$)$_2$, Te(GeiPr$_3$)$_2$ are showed in FIG. 1. It was observed that all these molecules could be volatized without leaving significant residues. This proves that decomposition of the molecule did not occur, while some of the molecules were heated at relatively high temperature (>300° C.). The volatility of the molecules can also be assessed from these TGAs. Te(SiMe$_3$)$_2$ seems to be the more volatile precursor, as it was fully evaporated at 180C. Te(SitBuMe$_2$)$_2$ is ranked second in terms of volatility, with a full evaporation at around 240° C. Te(SiiPr$_3$)$_2$ and Te(GeiPr$_3$)$_2$ exhibited roughly the same evaporation pattern, Te(GeiPr3)2 being slightly less volatile, which may be due to the heavy weight of germanium vs. silicon. The volatility and evaporation patterns of all these molecules fit to the criteria of CVD/ALD molecules.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A method of forming a tellurium containing film on a substrate; comprising:
   a) providing a reactor and at least one substrate disposed therein;
   b) introducing a tellurium precursor into the reactor, wherein the tellurium precursor is selected from the group consisting of Te(GeMe$_3$)$_2$, Te(GeEt$_3$)$_2$, Te(GeiPr$_3$)$_2$, Te(GetBu$_3$)$_2$, and Te(GetBuMe$_2$)$_2$;
   c) maintaining the reactor at a temperature of at least about 100° C.; and
   d) depositing at least part of the tellerium precursor onto the substrate to form a tellerium containing film.

2. The method of claim 1, further comprising maintaining the reactor at a temperature between about 100° C. to about 500° C.

3. The method of claim 2, further comprising maintaining the reactor at a temperature between about 150° C. and about 350° C.

4. The method of claim 1, further comprising maintaining the reactor at a pressure between about 1 Pa and about 10$^5$ Pa.

5. The method of claim 4, further comprising maintaining the reactor at a pressure between about 25 Pa and about 10$^3$ Pa.

6. The method of claim 1, further comprising introducing at least one reducing gas into the reactor, wherein the reducing gas comprises at least one member selected from the group consisting of: H$_2$; NH$_3$; SiH$_4$; Si$_2$H$_6$, Si$_3$H$_8$; hydrogen radicals; and mixtures thereof.

7. The method of claim 6, wherein the tellurium precursor and the reducing gas are introduced into the chamber either substantially simultaneously, or sequentially.

8. The method of claim 7, wherein the reducing gas and the tellurium precursor are introduced into the chamber substantially simultaneously, and the chamber is configured for chemical vapor deposition.

9. The method of claim 7, the reducing gas and the tellurium precursor are introduced into the chamber sequentially, and the chamber is configured for atomic layer deposition.

10. The method of claim 1, further comprising introducing at least one germanium containing precursor and at least one antimony containing precursor into the reactor; and depositing at least part of the germanium and antimony containing precursors onto the substrate to form a germanium, tellurium and antimony containing film.

* * * * *